(12) United States Patent
Lin et al.

(10) Patent No.: US 12,241,690 B2
(45) Date of Patent: Mar. 4, 2025

(54) THERMAL MODULE STRUCTURE

(71) Applicant: ASIA VITAL COMPONENTS CO., LTD., New Taipei (TW)

(72) Inventors: Sheng-Huang Lin, New Taipei (TW); Yuan-Yi Lin, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 220 days.

(21) Appl. No.: 18/064,294

(22) Filed: Dec. 12, 2022

(65) Prior Publication Data

US 2023/0243598 A1    Aug. 3, 2023

(51) Int. Cl.
  *F28D 15/00*    (2006.01)
  *F28D 15/02*    (2006.01)

(52) U.S. Cl.
  CPC ............... *F28D 15/0275* (2013.01)

(58) Field of Classification Search
  CPC .................................................. F28D 15/0275
  USPC ...................................................... 65/104.26
  See application file for complete search history.

(56) References Cited

U.S. PATENT DOCUMENTS

| | | | |
|---|---|---|---|
| 2009/0266522 A1* | 10/2009 | Lin | ............ H01L 23/427 29/890.032 |
| 2013/0000870 A1 | 1/2013 | Wu | |

FOREIGN PATENT DOCUMENTS

| | | |
|---|---|---|
| CN | 112880449 A | 6/2021 |
| TW | 200412832 A | 7/2004 |
| TW | 200415981 A | 8/2004 |
| TW | M310370 U * | 4/2007 |
| TW | M627850 U | 6/2022 |

OTHER PUBLICATIONS

Search Report dated Aug. 17, 2022 issued by Taiwan Intellectual Property Office for counterpart application No. 111103912. China National Intellectual Property Administration.

* cited by examiner

*Primary Examiner* — Davis D Hwu
(74) *Attorney, Agent, or Firm* — Bradley J. Thorson; DeWitt LLP

(57) ABSTRACT

A thermal module structure includes an aluminum base having a heat pipe receiving groove formed on one side thereof; a heat dissipation unit including a plurality of radiation fin assemblies or heat sinks and being provided with a first heat pipe receiving section; a plurality of heat pipes made of a copper material and respectively having a heat absorption section and a horizontally extended condensation section; and a copper embedding layer provided on surfaces of the heat pipe receiving groove and the first heat pipe receiving section. The aluminum base and the heat dissipation unit are horizontally parallelly arranged. The heat absorption sections are fitted in the heat pipe receiving groove, and the condensation sections are extended through the first heat pipe receiving section. With the copper embedding layer, the aluminum base and the heat dissipation unit can be directly welded to the heat pipes.

5 Claims, 3 Drawing Sheets

(A-A profile)

(A-A profile)

(B-B profile)

THERMAL MODULE STRUCTURE

This application claims the priority benefit of Taiwan patent application number 111103912 filed on Jan. 28, 2022.

FIELD OF THE INVENTION

The present invention relates to a thermal module structure, and more particularly, to a thermal module structure that overcomes difficulties in welding aluminum heat dissipation elements to copper heat transfer elements.

BACKGROUND OF THE INVENTION

Copper metal material is characterized by its high efficiency of heat conduction, and is therefore often selected for making a base of the conventional thermal module structure for directly contacting with a heat source and absorbing heat produced by the heat source; the heat absorbed by the copper base is further transferred to copper heat pipes that speed the heat conduction and to a plurality of copper radiation fins that provide increased heat dissipation areas and better heat dissipation efficiency. However, the base and the radiation fins made of copper are relatively heavy and require relatively high material cost, and they are gradually replaced by aluminum base and aluminum fins in recent years.

While the use of aluminum in place of copper largely improves the problems of heavy weight and expensive material cost, aluminum material has its own disadvantages. For example, the aluminum surfaces of the aluminum base tend to oxidize easily and will produce aluminum oxide ($Al_2O_3$) during the welding process. The aluminum oxide has a high melting point, which prevents the weld metal from being fully molten and brings difficulties to the welding operation.

When directly welding copper material to aluminum material, areas of the two materials subjected to direct welding will become brittle to form cracks. Further, in the process of welding copper to aluminum, one side the welding joint located closer to the copper material tends to form copper aluminide ($CuAl_2$) eutectic, which is distributed in the vicinity of grain boundaries to easily cause the problem of fatigue crack propagation through grain boundaries. Besides, copper and aluminum materials are quite different in their melting points and eutectic temperatures. When the surface of the aluminum material has fully molten in the welding operation, the copper material is still in a solid phase. On the other hand, when the copper material is molten, the aluminum material has long been molten and could not co-exist with the molten copper material in the eutectic state to cause largely increased difficulties in welding the copper material to the aluminum material. Further, since air pores are easily formed at the welding joint and since copper material and aluminum material all have good heat conductivity, the metal in the weld pool crystallizes quickly, which prevents the reaction gas used in pyrometallurgy from timely escaping from the weld pool to therefore form air pores easily. Owing to these problems, aluminum material and copper material could not be directly welded together at the contact areas between them. Conventionally, the surface of aluminum material must be subjected to surface modification to enable subsequent welding of the aluminum material to copper material or other metal materials. To solve the above situation that the use of aluminum material in place of copper material brings the problem that the aluminum material could not be directly welded to the copper material and other dissimilar metal materials, electroless nickel plating is adopted by persons skilled in the art as the technical means of metal surface modification. Electroless nickel plating is also referred to as chemical deposition or autocatalytic plating, and can be classified into three types, i.e. low, middle and high phosphorus electroless nickel plating. There are three types of electroless nickel plating solution. The first type contains activator, sensitizer, and an acidic plating bath having a pH value between 4 and 6, and is characterized in that less loss in chemical composition is caused by evaporation; this type of electroless nickel plating solution requires a relatively higher operating temperature, but is considerably safe for use and easy to control; and it has high phosphorus content and high plating rate and is often used in the industrial field. The second type contains activator, sensitizer, and a basic plating solution or bath having a pH value between 8 and 10. Since ammonia solution used to adjust the pH value of the plating bath is volatile, it must be replenished timely to maintain stable pH value of the plating bath; this type of electroless nickel plating solution has less phosphorus content, is less stable and needs only a lower operating temperature. (3) The third type contains HPM and a basic plating solution. HPM means a mixture of hydrochloric acid and peroxide. When a silicon chip is immersed in a mixture of deionized (DI) water, aqueous hydrogen peroxide ($H_2O_2$) and aqueous hydrogen Chloride (HCl) in a mixing ratio of 4:1:1, the oxide layer formed on the surface of the silicon chip can replace the sensitizer and the activator to form an autocatalytic surface.

In the process of electroless nickel plating, a large quantity of chemical reaction liquid is required, and a large amount of industrial liquid waste containing heavy metals or chemical substances will be produced after the process. Industrial liquid waste generates a large amount of wastewater that contains toxicants, such as yellow phosphorus, and is therefore not reusable and must be recycled and treated by a dedicated unit instead of being directly discharged into environment to cause environmental pollution. In the case of yellow phosphorus containing wastewater, the concentration of yellow phosphorus thereof reaches 50~390 mg/L. Yellow phosphorus is highly toxic, and its existence in human body would badly endanger liver and other organs. Drinking phosphorus-containing water for a long time would result in osteoporosis to cause different diseases, such as mandible necrosis. Therefore, many countries in the world have forbidden the use of electroless nickel plating, and non-toxic chemical processes are actively promoted to ensure environmental protection.

It is therefore an important target at this stage to develop a thermal module structure, which has a reduced overall weight and can overcome the difficult welding of aluminum elements directly to other heat dissipation elements made of dissimilar metal materials without using electroless nickel plating.

SUMMARY OF THE INVENTION

To effectively solve the above problems, a primary object of the present invention is to provide a thermal module structure, which does not require electroless nickel plating while allows aluminum heat dissipation elements to be directly welded to other heat dissipation elements made of dissimilar materials.

To achieve the above and other objects, the thermal module structure according to the present invention includes an aluminum base, a heat dissipation unit, a plurality of heat pipes, and a copper embedding layer.

The aluminum base has a heat pipe receiving groove formed on one side thereof.

The heat dissipation includes a radiation fin assembly formed of a plurality of radiation fins fastened to one another; the radiation fin assembly has a first heat pipe receiving section formed on one side thereof; and the heat dissipation unit and the aluminum base are horizontally parallelly arranged or horizontally serially arranged.

The copper embedding layer is provided on inner surfaces of the heat pipe receiving groove of the aluminum base and the first heat pipe receiving section of the heat dissipation unit.

The heat pipes are made of a copper material and respectively have an end being a heat absorption section fitted in the heat pipe receiving groove and another horizontally extended end being a remote condensation section connected to the first heat pipe receiving section. With the copper embedding layer, the aluminum base and the heat dissipation unit can be directly welded to the copper heat pipes.

In the present invention, with the provision of the copper embedding layer on areas of the aluminum heat dissipation elements that are to be connected to other elements, the aluminum heat dissipation elements can be directly welded to other heat dissipation element of dissimilar materials without the need of subjecting to electroless nickel plating in advance. In this way, the problems of difficult welding of the aluminum heat dissipation elements to other heat transfer elements made of dissimilar materials and environmental pollution caused by the conventional electroless nickel plating can be improved.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
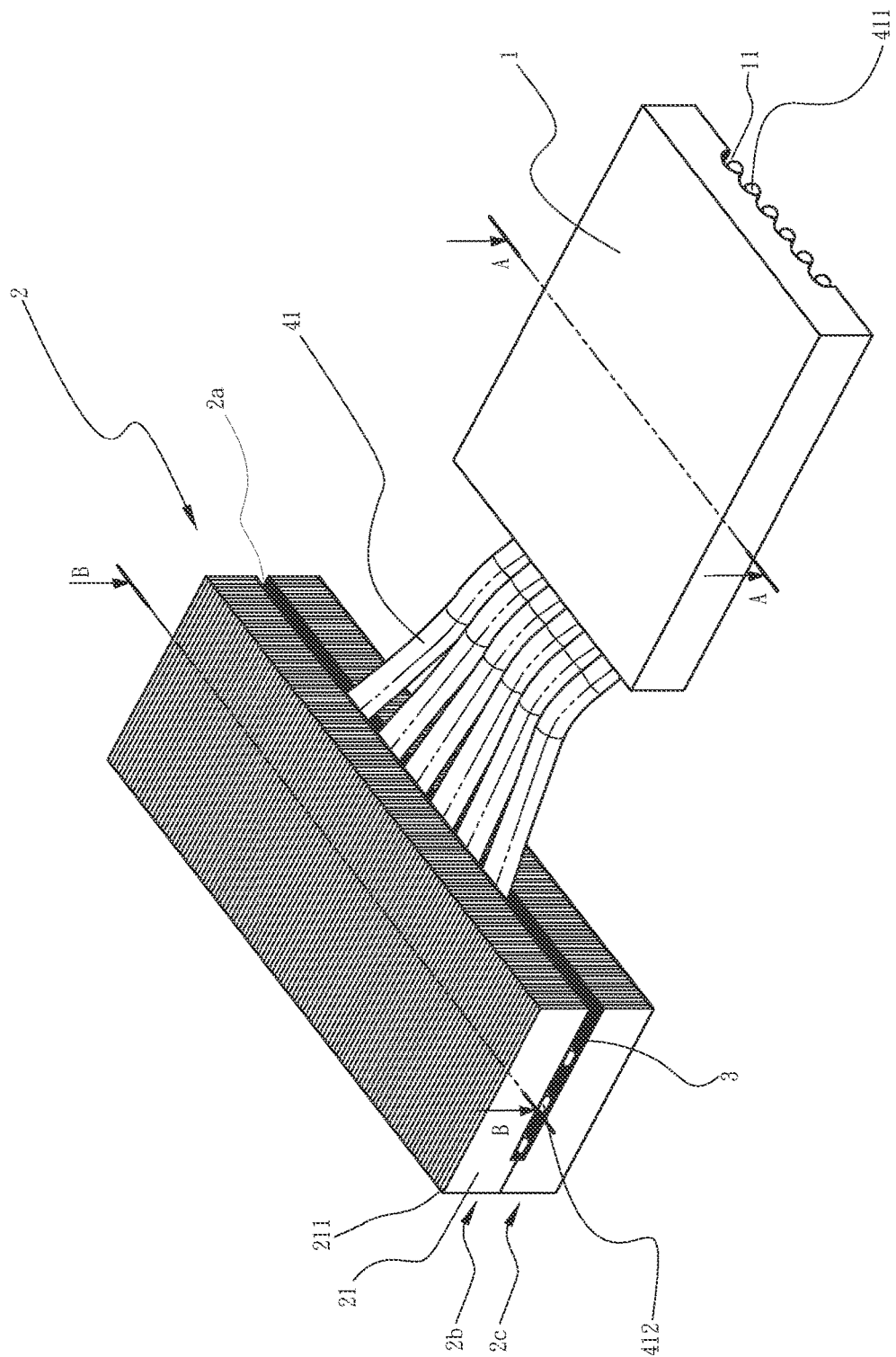
FIG. 1 is an exploded perspective view of a thermal module structure according to a first embodiment of the present invention.

The present invention will now be described with some preferred embodiments thereof. For the purpose of easy to understand, elements that are the same in the preferred embodiments are denoted by the same reference numerals.

Figure 2A:
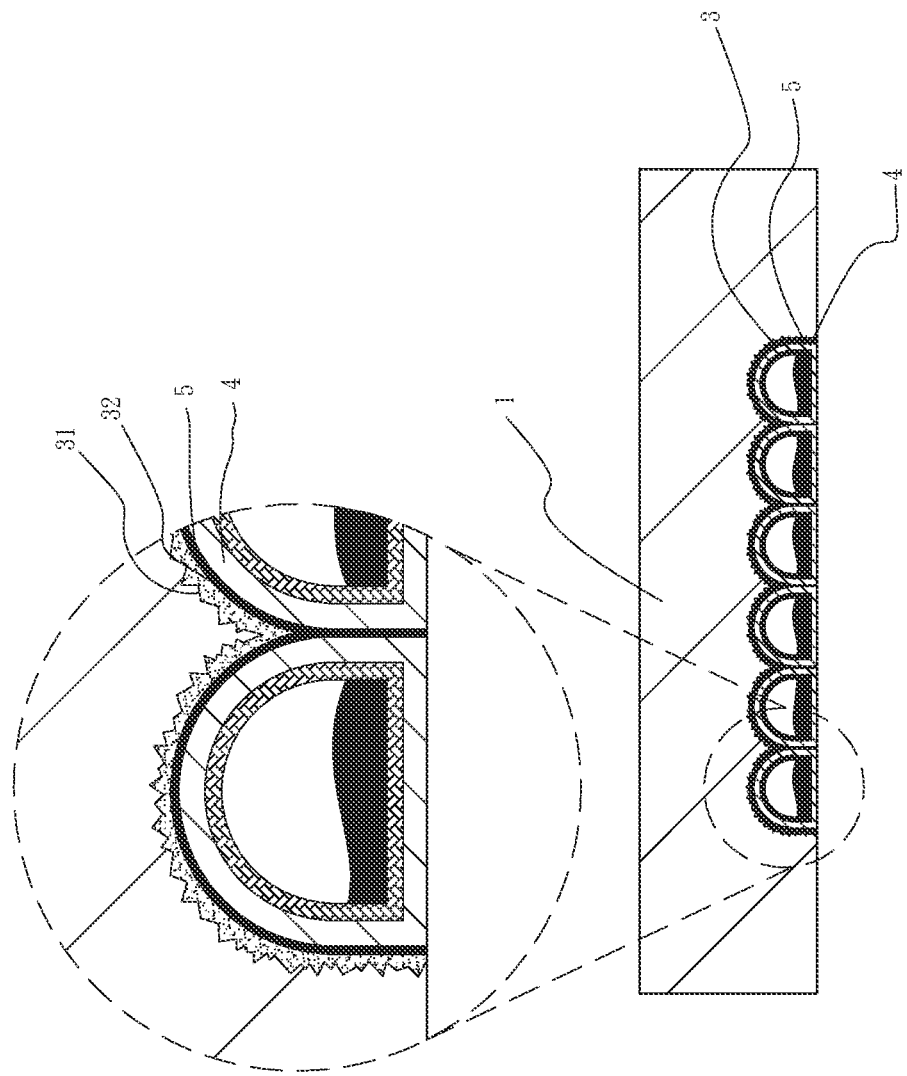
FIG. 2a is an assembled sectional view of the thermal module instruction of the present invention.
Figure 2B:
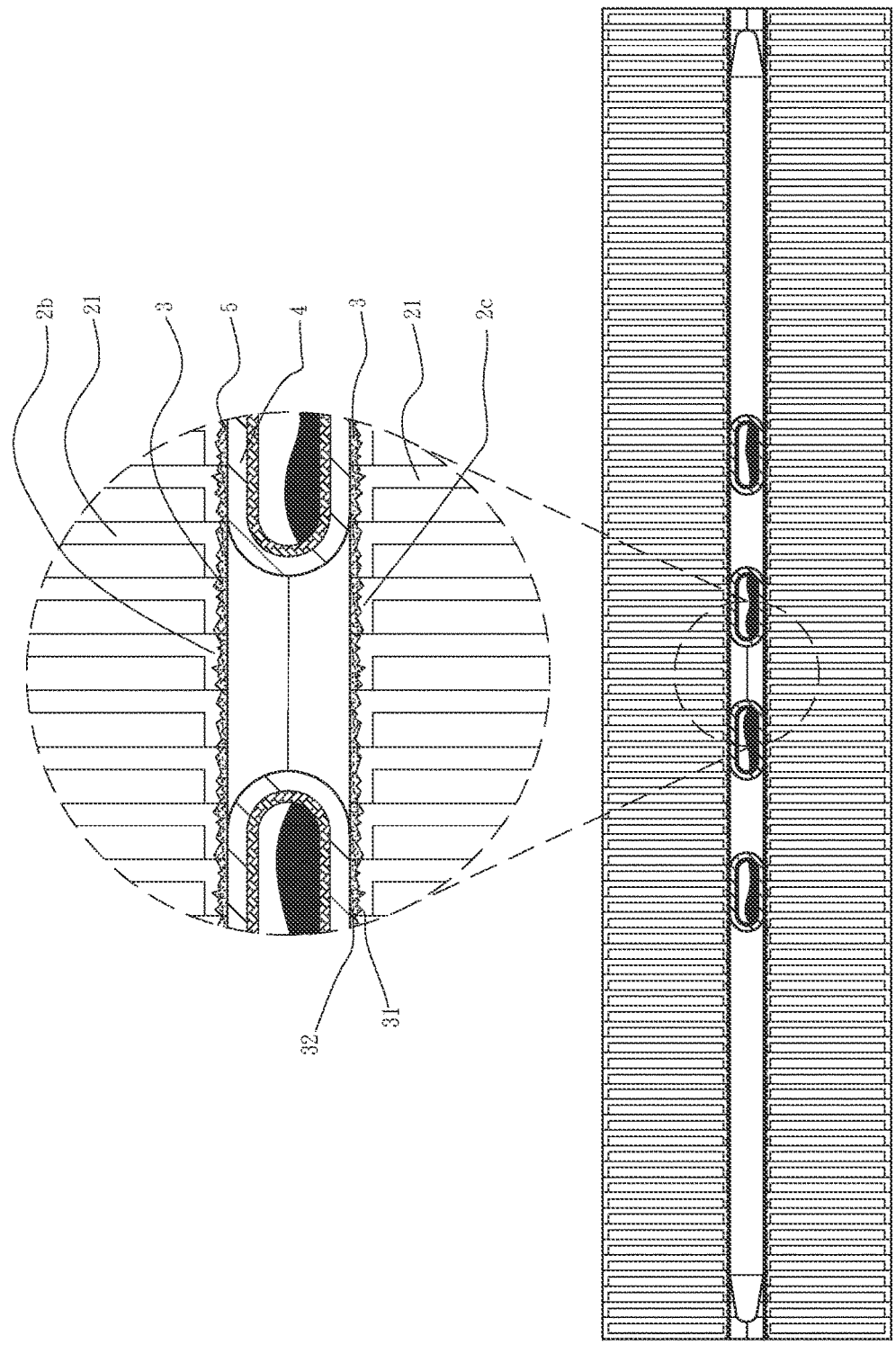
FIG. 2b is another assembled sectional view of the thermal module structure of the present invention.

Please refer to FIG. 1, which is an exploded perspective view of a thermal module structure according to a first embodiment of the present invention; and to FIGS. 2a and 2b, which are two assembled sectional views of the thermal module structure of FIG. 1. As shown, the thermal module structure according to the first embodiment of the present invention includes an aluminum base 1, a heat dissipation unit 2, a copper embedding layer 3, a plurality of heat pipes 4, and a welder layer 5.

The aluminum base 1 is provided on one side with at least one heat pipe receiving groove 11. The side of the aluminum base 1 having the heat pipe receiving groove 11 is a heat absorption side in contact with at least one heat source (not shown). The heat pipes 4 include a plurality of first heat pipes 41 received in and connected to the heat pipe receiving groove 11. Optionally, the first heat pipes 41 in the heat pipe groove 11 are flush with the heat absorption side.

The heat dissipation unit 2 is a heat dissipation fin assembly formed of a plurality of radiation fins fastened to one another, and has a first heat pipe receiving section 2a formed at a central or a lower portion thereof. The heat dissipation unit 2 and the aluminum base 1 are horizontally parallelly arranged or horizontally serially arranged. And, when the aluminum base 1 and the heat dissipation unit 2 are horizontally parallelly arranged, they can be located at the same or different heights.

To further enable convenient manufacturing, the heat dissipation unit 2 can be assembled from a first radiation fin assembly 2b and a second radiation fin assembly 2c. The first radiation fin assembly 2b includes a plurality of radiation fins 21, each of which has at least one pair of bent edges 211, at where the radiation fins 21 are fastened to one another. Similarly, the second radiation fin assembly 2b includes a plurality of radiation fins 21, each of which has at least one pair of bent edges 211, at where the radiation fins 21 are fastened to one another. In the illustrated embodiment, the first radiation fin assembly 2b is superposed on a top of the second radiation fin assembly 2c; and the first heat pipe receiving section 2a for receiving and connecting to the first heat pipes 41 is defined between the first and the second radiation fin assembly 2b, 2c.

The heat pipes 4 respectively have an end being a heat absorption section 411 fitted in the heat pipe receiving groove 11; and another horizontally extended end being a remote condensation section 412 connected to the first heat pipe receiving section 2a of the heat dissipation unit 2.

The copper embedding layer 3 is provided on surfaces of the heat pipe receiving groove 11 and the first heat pipe receiving section 2a. With the provision of the copper embedding layer 3, the aluminum base 1 and the heat dissipation unit 2 can be directly connected to the first heat pipes 41 by welding without the need of subjected to electroless nickel plating in advance.

The weld layer 5 is located between the copper embedding layer 3 and the heat pipes 4 to provide enhanced bond of the aluminum base 1 and the heat dissipation unit 2 to the heat pipes 4.

The copper embedding layer 3 has a deepening surface 31 and a connecting surface 32 located at two opposite sides thereof. The deepening surface 31 deeply grips the surfaces of the heat pipe receiving groove 11 and the first heat pipe receiving section 2a, and deeply penetrates into the aluminum base 1. The connecting surface 32 is an exposed surface of the copper embedding layer 3 for welding to the weld layer 5 or directly connecting to another element of similar or dissimilar materials by welding.

The condensation sections 412 of the heat pipes 4 can be serially extended through and connected to the first heat pipe receiving section 2a of the heat dissipation unit 2 by loose-fit or tight-fit. In the case of connecting by loose-fit, the copper embedding layer 3 must be provided at contact areas between the first heat pipe receiving section 2a of the heat dissipation unit 2 and the heat pipes 4 in advance, so that the heat pipes 4 and the heat dissipation unit 2 can be directly connected together by welding. On the other hand, in the case of connecting by tight-fit, the first heat pipe receiving section 2a is tightly pressed against the condensation sections 412.

The copper embedding layer 3 is provided on areas of the aluminum base 1 for connecting to the heat pipes 4 by way of high-speed spraying, printing, electroplating, or machining. The copper embedding layer 3 can be copper sheet, copper foil, copper powder/granules or liquid copper applied to the surfaces of the heat pipe receiving groove 11 and the first heat pipe receiving section 2a through mechanical processing, such as high-pressure extruding, or surface finishing, such as spraying, electroplating or printing. In the course of forming the copper embedding layer 3, a part of the copper embedding layer 3 would directly grip, be implanted into, or be embedded in the surfaces of the heat pipe receiving groove 11 and the first heat pipe receiving section 2a. In this manner, the copper embedding layer 3 not only has the connecting surface 32 attached to the surfaces of the heat pipe receiving groove 11 and the first heat pipe receiving section 2a, but also has the deepening surface 31 that directly grips, is implanted into, or is embedded in the surfaces of the heat pipe receiving groove 11 and the first heat pipe receiving section 2a to form a foundation of the copper embedding layer 3 and enhance the bond strength of the copper embedded layer 3 to the surfaces of the heat pipe receiving groove 11 and the first heat pipe receiving section 2a, preventing the copper embedding layer 3 from peeling or flaking off from the heat pipe receiving groove 11 and the first heat pipe receiving section 2a.

In a second embodiment of the present invention, a plurality of second heat pipes and a third and a fourth heat radiation fin assembly are further provided. In the second embodiment, the condensation sections 412 of the first heat pipes 41 extend horizontally to connect to the first and the second radiation fin assembly 2b, 2c; and the second heat pipes respectively have a condensation section located at a position higher than the first and the second radiation fin assembly 2b, 2c and extended to connect to the third and the fourth radiation fin assembly. That is, the third and the fourth radiation fin assembly are located higher than the first and the second radiation fin assembly 2b, 2c; and the fourth radiation fin assembly is not in contact with the first radiation fin assembly 2b. Areas correspondingly located between the third and the fourth radiation fin assembly and not connected with one another provide a recessed space, in where a second heat pipe receiving section is formed. The second heat pipes respectively have a heat absorption section, which are fitted in the heat pipe receiving groove 11 of the aluminum base 1; and the condensation sections of the second heat pipes are received in the second heat pipe receiving section.

Alternatively, the third and the fourth radiation fin assembly can be separately located at two lateral sides of the first and the second radiation fin assembly 2b, 2c, so that the four radiation fin assemblies are located horizontally in parallel. And, a part of the condensation sections of the second heat pipes are connected to the third and the fourth radiation fin assembly.

In a third embodiment of the present invention, the heat dissipation unit 2 is in the configuration of a heat sink with the first heat pipe receiving section 2a formed at a central or a lower portion thereof.

In the third embodiment, the heat dissipation unit 2 is formed of a first heat sink and a second heat sink to enable convenient manufacturing and assembling thereof. The first heat sink includes a first base and a plurality of radiation fins extended from one side of the first base; and the second heat sink includes a second base and a plurality of radiation fins extended from one side of the second base. The first base and the second base are fitly attached to each other; and the first heat pipe receiving section 2a is located between the first and the second base. In the third embodiment, the heat pipes 4 include a plurality of first heat pipes 41, each of which has a heat absorption section 411 fitted in the heat pipe receiving groove 11 formed on the first and the second base; and a condensation section received in the first heat pipe receiving section 2a.

The first and the second heat sink are made of an aluminum material. In a fourth embodiment, which is similar to the second embodiment, a third and a fourth heat sink can be further provided in place of the third and fourth radiation fin assemblies; and the heat pipes 4 further include a plurality of second heat pipes, which are connected at their condensation sections to the third and the fourth heat sink. No matter the condensation sections of the heat pipes 4 are connected to the first to fourth radiation fin assemblies or to the first to fourth heat sinks, areas on the first to fourth radiation fin assemblies or on the first to fourth heat sinks for connecting to the heat pipes 4 must first have the copper embedding layer 3 formed thereon before the first to the fourth radiation fin assembly or the first to the fourth heat sink are connected to the heat pipes 4 via the weld layer 5.

In the third and the fourth embodiment, the aluminum base 1 and the heat dissipation unit 2 are parallelly arranged at the same height or different heights.

In the above described embodiments, the heat dissipation unit 2 and the first heat pipes 41 and the second heat pipes can be connected by tight-fit or loose-fit. In the case of loose-fit, the copper embedding layer 3 is provided on the surfaces of the first and second heat pipe receiving sections 2a, so that the condensation sections can be directly welded to the first and second heat pipe receiving sections 2a. On the other hand, in the case of tight-fit, the first and second heat pipe receiving sections 2a are tightly pressed against the condensation sections.

The conventional thermal module structure is a combination of an aluminum base, heat pipes, and aluminum radiation fin assemblies or aluminum heat sinks. The connection between the heat pipes and the aluminum radiation fin assemblies or the aluminum heat sinks or between two or more aluminum radiation fin assemblies is achieved by welding. However, since the aluminum material could not be directly welded to other metal materials, areas on the aluminum radiation fin assemblies that are to be connected to each other or to heat pipes must first have a nickel coating deposited on them using electroless nickel plating, so as to enable successful welding of the heat pipes to the aluminum radiation fin assemblies or the aluminum base. But electroless nickel plating would cause serious environmental pollution, which draws worldwide attention and is asked to improve. The present invention provides a novel way to omit the conventional electroless nickel plating by providing a copper embedding layer at areas on the aluminum base and the aluminum radiation fin assembly of the thermal module structure that are to be connected to the heat pipes, enabling successful welding of the aluminum base and the aluminum radiation fin assembly to the heat pipes directly. With the copper embedding layer provided according to the present invention, it is able to overcome the environmental pollution and other problems brought by the use of electroless nickel plating in manufacturing the conventional thermal module.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A thermal module structure, comprising:

an aluminum base having at least one heat pipe receiving groove formed on one side thereof;

a heat dissipation unit including at least one radiation fin assembly formed of a plurality of radiation fins fastened to one another; the radiation fin assembly having a first heat pipe receiving section formed on one side thereof; and the heat dissipation unit and the aluminum base being horizontally parallelly arranged;

a copper embedding layer being provided on a surface of the heat pipe receiving groove, wherein the copper embedding layer includes a deepening surface and a connecting surface formed at two opposite sides of the copper embedding layer; the deepening surface gripping and penetrating into surfaces of the heat pipe receiving groove and the first heat pipe receiving section; and the connecting surface being an exposed surface of the copper embedding layer for connecting with a weld layer; and a plurality of heat pipes made of a copper material and respectively having an end being a heat absorption section fitted in the heat pipe receiving groove and another horizontally extended end being a remote condensation section connected to the first heat pipe receiving section of the heat dissipation unit; and wherein the aluminum base and the heat dissipation unit can be directly welded to the heat pipes via the copper embedding layer.

2. The thermal module structure as claimed in claim 1, wherein the heat dissipation unit includes a first and a second radiation fin assembly both made of an aluminum material; the first radiation fin assembly including a plurality of radiation fins respectively having at least one pair of bent edges, and the radiation fins being assembled to form the first radiation fin assembly by fastening the bent edges to one another; similarly, the second radiation fin assembly including a plurality of radiation fins respectively having at least one pair of bent edges, and the radiation fins being assembled to form the second radiation fin assembly by fastening the bent edges to one another; the first radiation fin assembly being superposed on the second radiation fin assembly; areas correspondingly located between the first and the second radiation fin assembly and not connected with one another providing a recessed space, in where the first heat pipe receiving section is formed; and wherein the heat pipes includes a plurality of first heat pipes, of which the heat absorption sections being fitted in the heat pipe receiving groove of the aluminum base, and the condensation sections being received in the first heat pipe receiving section by loose-fit; and wherein the copper embedding layer is also provided on surfaces of the first heat pipe receiving section, enabling the condensation sections to be directly welded to the first heat pipe receiving section.

3. The thermal module structure as claimed in claim 1, wherein the condensation sections are connected to the first heat pipe receiving section by tight-fit, that is, the first heat pipe receiving section is tightly pressed against the condensation sections.

4. The thermal module structure as claimed in claim 1, further comprising a weld layer provided between the copper embedding layer and the heat pipes to facilitate fixedly connection of the aluminum base and the heat dissipation unit to the heat pipes; and the aluminum base and the heat dissipation unit being parallelly arranged at the same height or different heights.

5. The thermal module structure as claimed in claim 1, wherein the aluminum base and the heat dissipation unit are parallelly arranged at the same height or different heights.

* * * * *